United States Patent [19]

McKelvey

[11] Patent Number: 4,545,882

[45] Date of Patent: Oct. 8, 1985

[54] METHOD AND APPARATUS FOR DETECTING SPUTTERING TARGET DEPLETION

[75] Inventor: Harold E. McKelvey, Plymouth, Mich.

[73] Assignee: Shatterproof Glass Corporation, Detroit, Mich.

[21] Appl. No.: 528,951

[22] Filed: Sep. 2, 1983

[51] Int. Cl.$^4$ .............................................. C23C 15/00
[52] U.S. Cl. .................................. 204/192 R; 204/298
[58] Field of Search ............................. 204/298, 192 R

[56] References Cited

U.S. PATENT DOCUMENTS

| | | | |
|---|---|---|---|
| 4,166,783 | 9/1979 | Turner | 204/192 R |
| 4,311,725 | 1/1982 | Holland | 427/10 |
| 4,341,816 | 7/1982 | Lauterbach et al. | 427/34 |
| 4,374,722 | 2/1983 | Zega | 204/298 |
| 4,407,708 | 10/1983 | Landau | 204/192 R |

Primary Examiner—Andrew H. Metz
Assistant Examiner—William T. Leader
Attorney, Agent, or Firm—David T. Innis

[57] ABSTRACT

In the operation of sputtering targets, whether the targets are planar or cylindrical, magnetically enhanced or not, they are provided with a detectable material underlying the coating material carried on the target. As the target becomes depleted, the underlying material becomes deposited on the substrate and is then detected when appearing on the substrate. The detectable material can be a radioactive substance, an electrical characteristic detectable substance such as iron, an optically detectable substance such as copper or gold which is highly reflective, or a fluorescent substance. The target may have a thinner section of coating material immediately above the detectable material or the detectable material may be deeply imbedded in the target where the target is a solid substance and is water cooled from the opposed surface.

17 Claims, 7 Drawing Figures

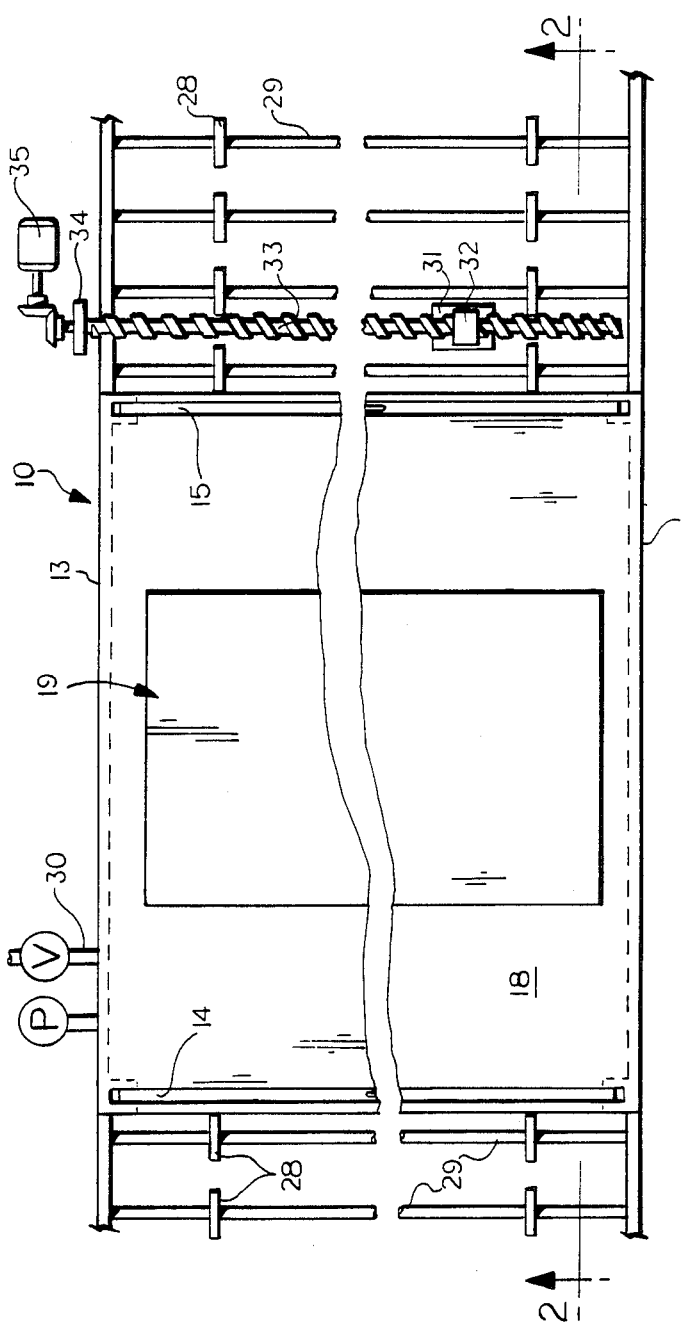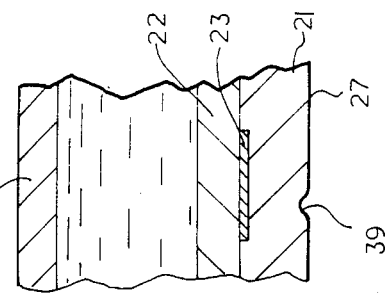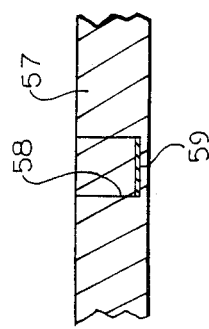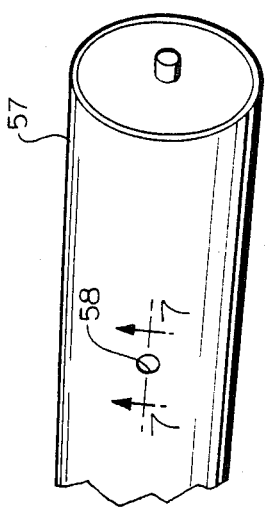

METHOD AND APPARATUS FOR DETECTING SPUTTERING TARGET DEPLETION

The present invention relates to a method and system for determining when a cathodic sputtering target has become eroded to the point that it should be replaced.

BACKGROUND OF THE INVENTION

Recent developments in high rate cathodic sputtering, particularly those obtained using magnetic fields which enhance the sputtering, presently provide a major contribution to the coating field. This is particularly true in that situation where relatively large surface areas of substrate are being coated by the use of fairly large sputtering targets. A problem in the commercial operation of a sputtering target is the desirability of an essentially continuous production or manufacturing. This, of course, gives rise to a fairly fast consumption of the sputtering target. As the target consumption proceeds, the point may be reached where either piercing the target sputtering or eroding of the underlying conductive target supporting material will occur. It is a continuing concern to be able to avoid such erosion of the underlying conductive material. In the case of a sputtering target that is backed by direct water cooling, there is that great danger of piercing the target and water passing through the target into the sputtering chamber.

High rate sputtering systems presently used are designed to insure target cooling, which is necessary because of the relatively high power used, and these cooling systems have become one of two basic designs. One is termed the direct cooling arrangement where the liquid coolant is circulated directly along the back of the sputtering target, in which case the target piercing causes some major damage within the vacuum chamber by flooding it with coolant. The direct cooling arrangement as described above is used where the sputtering material or target is bonded to a suitable intermediate support. Generally, in the case of a cylindrical sputtering system where the target is in the form of a cylinder, the underlying target support would be a conductive copper cylinder or possibly an aluminum cylinder. In this instance, the piercing of the target or the erosion of the target completely through at some point would result in the sputtering of the underlying copper or aluminum substrate. Again, this is undesirable from the point of view that it would require replacement or costly repair to the underlying substrate. In this instance, the cooling would be applied to the interior of the substrate.

At the present time, the exact instant of target piercing is unforseeable and, to be on the cautious side, usually the time of sputtering is logged and when the estimated depletion time is approaching, the system is shut down and the target replaced. This shutting down of the system when there may be several days or, at the least, several hours of safe sputtering is a costly and wasteful procedure. In normal operation, however, it is better to err on the side of caution rather than try to run the sputtering operation for too long a period and harm the underlying substrate or pierce the target to the extent of letting coolant to enter the sputtering chamber.

A system for determining target piercing has been the subject of a recent U.S. Pat. No. 4,374,722, issued Feb. 22, 1983. This patent teaches the positioning of a gas chamber behind the sputtering target and under sufficient pressure such that the gas, when the target becomes pierced, will pass into the sputtering chamber. The presence of the gas in the sputtering chamber is then detected and the system shut down so that the target may be replaced.

The above patent discloses the use of the principle of the invention upon which the patent is based, to both cylindrical targets as shown, for example, in FIG. 1, or planar targets, for example, as shown in FIG. 7. In both instances, the target is of the magnetically enhanced type which produces a more efficient sputtering system. The cylindrical targets of the above-cited patent are for the purpose of sputtering on cylindrical substrates or substrates in surrounding relationship thereto.

Another recently issued U.S. Pat. No. 4,356,073 discloses a magnetron cathode sputtering apparatus in which the cathode or target is in the form of an elongated, cylindrical tube having a layer of the coating material to be sputtered applied to the outer surface thereof. Magnetic means is mounted within the tube and includes at least one row of permanent U-shaped magnets extending lengthwise of the tube. This tube is horizontally arranged and the magnets are positioned in the lower, inside portion of the tube. The substrate to be sputtered is positioned beneath the tube and may be moved relative thereto to provide sputtering over a relatively long substrate, with the substrate's width being somewhat less than the length of the cylinder. The significant configuration of this patent is the ability to rotate the cylinder about its horizontal axis while maintaining the magnets in a constant downward orientation to provide a means for sputtering the target in a uniform manner about its entire cylindrical surface. Obviously, this provides an economical system, since the target may remain in the chamber for an extended period before requiring replacement. Both patents cited above teach the necessity of providing a cooling system for the interior in the case of a cylinder or reverse side of the planar cathode. In both patents, it is suggested that the cooling be effected by the use of circulating water in the cathode.

With the foregoing in view, it is an object of the present invention to provide a system for determining when the target material has become depleted to the extent that it requires the target to be replaced in the sputtering system.

It is a further object of this invention to provide a system for determining the impending depletion of the target material, whether the target material is a coating on a cathode support, or whether it is actually a part of the material of the cathode itself.

It is a further object of this invention to provide a system which will permit the operator to be alerted to the impending depletion at a point in time which will be sufficient to permit the timely shutdown of the sputtering system to avoid any possibility of significant erosion of the cathode having the target material thereon or to alert the operator to the depletion of the cathode itself when it is formed of the target material.

Other and further objects will be apparent from the following description taken in conjunction with the annexed sheets of drawings.

SUMMARY OF THE INVENTION

It is an object of the present invention to provide a method of monitoring the erosion of a water-cooled sputtering target or magnetron cathode by providing a thin layer of detectable material, immediate the target support, and under the coating material so that by monitoring the substrates being coated for traces of the detectable material one can ascertain the impending depletion of the target. The detectable material preferably is a radioactive substance with a Geiger counter being used to monitor the substrate.

BRIEF DESCRIPTION OF THE DRAWINGS

FIG. 1 is a schematic top plan view of the apparatus in accordance with one embodiment of the invention;

FIG. 3 is an enlarged sectional view of a portion of a planar cathode, similar to that of FIG. 1, but illustrating a second embodiment of the invention;

FIG. 6 is a perspective view, on a reduced scale, of an alternate form of cylindrical sputtering target from that of FIG. 5 showing a fourth embodiment of the present invention; and, FIG. 7 is an enlarged sectional view taken at line 7—7 of FIG. 6.

DETAILED DESCRIPTION OF THE DRAWINGS

Figure 2:
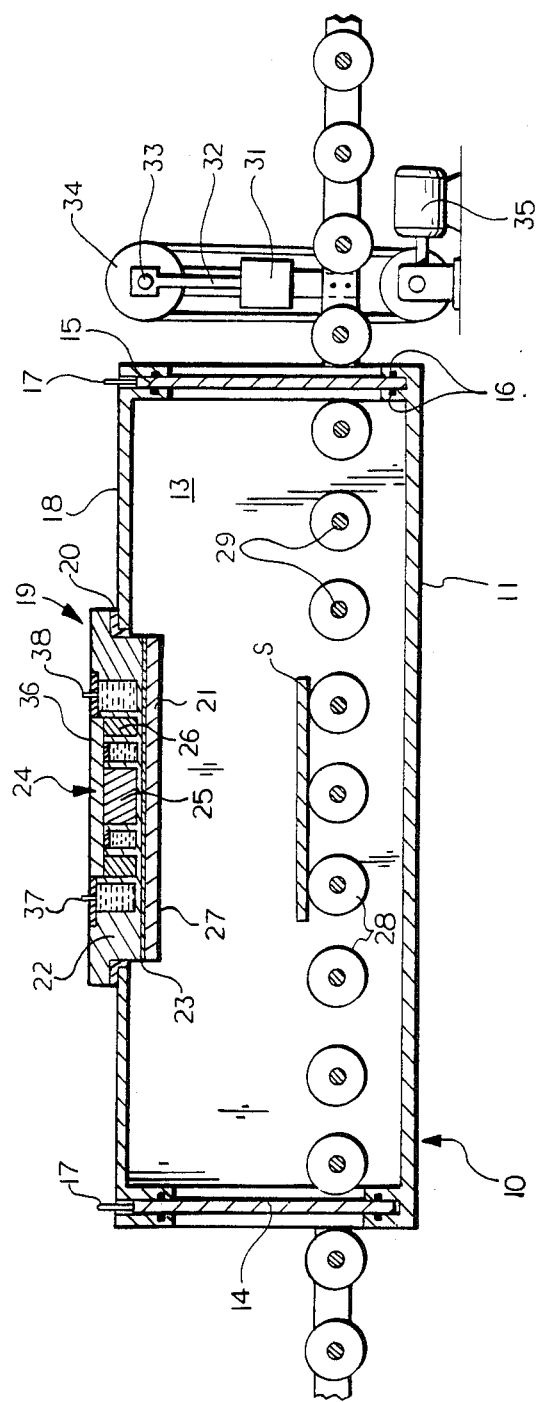
FIG. 2 is a vertical, sectional view taken along the line 2—2 of FIG. 1.

Referring to the drawings, and in particular to the first embodiment of the invention illustrated in FIGS. 1 and 2, there is shown a sputtering cathode of the planar, magnetically enhanced type. A chamber 10 is comprised of a bottom 11, sidewalls 12 and 13, and end gates 14 and 15. The end gates 14 and 15 are mounted so as to be vertically slidable relative to slideways provided in the ends of the chamber 10. These slideways have appropriate seals 16 for hermetically sealing the interior of the chamber 10 when the gates are in the position shown in FIG. 2. The gates 14 and 15 may be conveniently provided with handles 17 for raising the gates to provide access to the interior thereof from the incoming or feed end of the apparatus through the gate 14, and also to provide egress for coated substrates which will be moved through the exit gate 15. A top wall 18 is provided with a generally rectangular opening. Within the opening there is positioned a rectangular planar magnetron sputtering cathode, generally designated 19.

The cathode 19 is electrically separated from the enclosure 10 by means of an insulating gasket 20. The planar cathode 19 is faced with a target 21 formed of the material that is to be sputtered. The target material is adhered to or plated on a support 22 with an extremely thin intermediate layer 23 of a detectable material such as a radioactive, electroluminescent or fluorescent substance. Against the back face of the target support 22, and the adhered detectable substance 23, is mounted a magnet assembly 24, consisting of a central magnet 25 surrounded by an elongated magnet 26 in the form of an elongated annular track surrounding the central magnet 25. These concentric magnets 25 and 26 are axially magnetized in a reverse direction from each other so as to generate magnetic fields, the flux lines of which form a closed loop that arches over the planar sputtering face 27 of the target 21.

As can readily be seen in FIG. 2, a substrate S to be coated is positioned vertically below the target 21 and is supported on a series of rollers 28. The rollers 28 are rotatable about the axes of support shafts 29. The substrate S, for example, sheets of glass or glass plates, may be moved by motors driving the rollers 28 so as to advance the substrate through the sputtering chamber 10 in a predetermined controlled manner. The single target that is illustrated in FIG. 2 may be duplicated, if desired, so as to apply different materials through sputtering onto the substrate or could be used to provide increased coating thickness by being targets of the same material. Furthermore, if desirable and if suitable under the circumstances, only one of the targets would need to be operated at any one time.

The chamber 10, as illustrated in FIG. 1, is connected by a pump for the purpose of evacuating the chamber and pumping it down to the desired degree of vacuum in the neighborhood of $10^{-4}$ Torr. In addition, a valved passage 30 is connected to the interior of the chamber 10 for the purpose of introducing the ionizable gas, such as argon, which is necessary to sustain a plasma discharge within the chamber.

Beyond the exit end of the chamber 10, the series of rollers 28, which will support the substrate as it is being moved from the chamber 10, is mounted a detector 31. The detector 31 is illustrated as being mounted at the lower end of a supporting rod 32, whose upper end is internally threaded in a transverse direction to the rod 32 and is adapted to receive a threaded shaft 33. The threaded shaft 33 is mounted for rotation about its longitudinal axis, and at one end carries a pulley 34 which may be driven in either direction by a reversible electric motor 35.

The motor 35 will, in operation, drive the detector 31 across the width of the substrate and then reverse back to the opposite edge of the substrate. Thus, the detector 31, in effect, scans across the width of the substrate and, in the event the target 21 becomes eroded to the extent that the detectable material 23 has been sputtered, this material will be present in a quantity sufficient for the detector to sense its presence on the substrate as it is leaving the chamber 10. In this manner, the operator will be warned that the target has become depleted and the process may be stopped and the target replaced with a new target.

The detector is scanned across the width of the target in order to be certain of viewing that portion of the substrate which will have the detectable material thereon. There is no assurance that one portion of the target will become depleted before any other. It has been Applicant's experience, however, that the target tends to erode to a greater extent at its extreme ends and, therefore, by having the detector scan the substrate surface that has passed beneath the ends of the target, it will most likely provide an indication of the first sign of target depletion.

The magnetic assembly 24 further comprises a soft iron plate 36 mounted on the upper surface of the magnets for closing the flux lines on the upper side thereof. The main support plate 22 of the sputtering cathode 19 is also shown as being water-cooled through the circulating passages 37 and 38 connected thereto.

Turning now to FIG. 3, there is shown a second embodiment usable with the planar magnetron cathode of FIGS. 1 and 2. However, one should consider that FIG. 3 is, in effect, an enlarged sectional view taken through a modification of the water-cooled planar target of FIG. 1. The common elements of the target have been given the same reference numerals.

The embodiment illustrated in FIG. 3 shows, as previously stated, a limited sectional view normal to the direction of travel of a substrate through the coating chamber 10. In this embodiment, the target material 21 in its sputtering face 27 is provided with a slight impression or groove 39 which will extend parallel to the direction of movement of the substrate and this groove may be the full width of the target 21. During the sputtering operation, the target 21 will erode to a greater depth in alignment with this depression 39 and, when the target 21 is reaching the depletion state, an underlying detectable coating 23 will be sputtered prior to the support plate 22 being sputtered.

Inasmuch as the depression or groove will define that area of the target 21 which will be depleted first, it is only necessary to provide a detectable material 23 in the area which is in vertical alignment with the groove 39. Thus, only a narrow band of the detectable material 23 is required to be placed on the bottom of the supporting cathode plate 22. Additionally, the detector which is to determine the presence of the detectable material on the substrate need only be positioned in alignment with the position of the groove 39. Thus, when the target 21 approaches depletion, the substrate will be sputtered with the detectable material, and this will be then detected by the detector as the substrate is transported from the chamber. Scanning of the full substrate width will not be necessary since the predetermined positioning of the detector is aligned with the line of detectable material sputtering.

Figure 5:
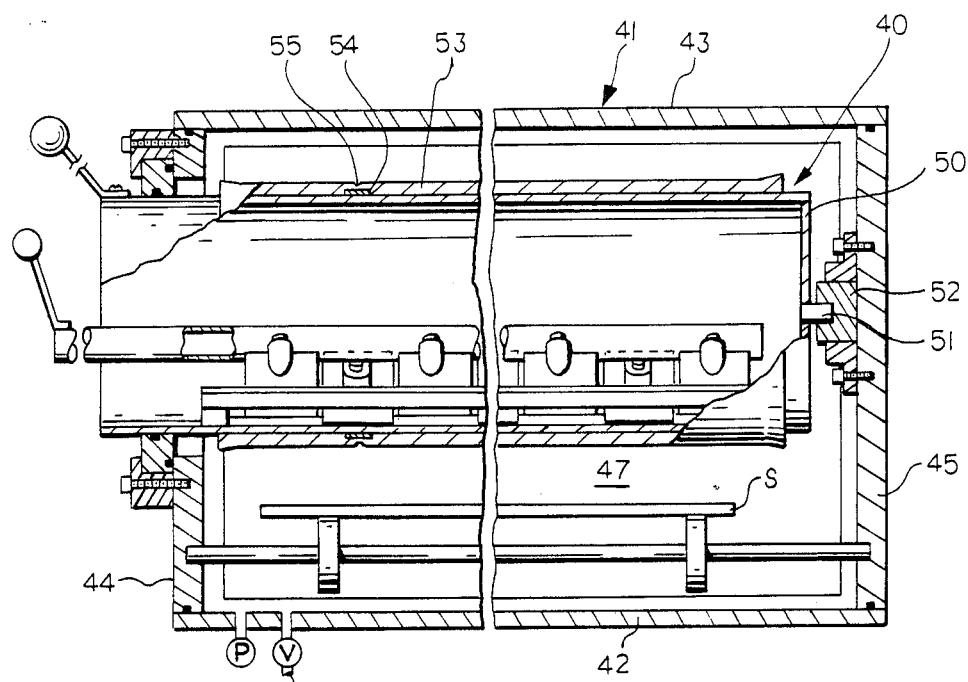
FIG. 5 is a vertical, sectional view taken at line 5—5 of FIG. 4.
Figure 4:
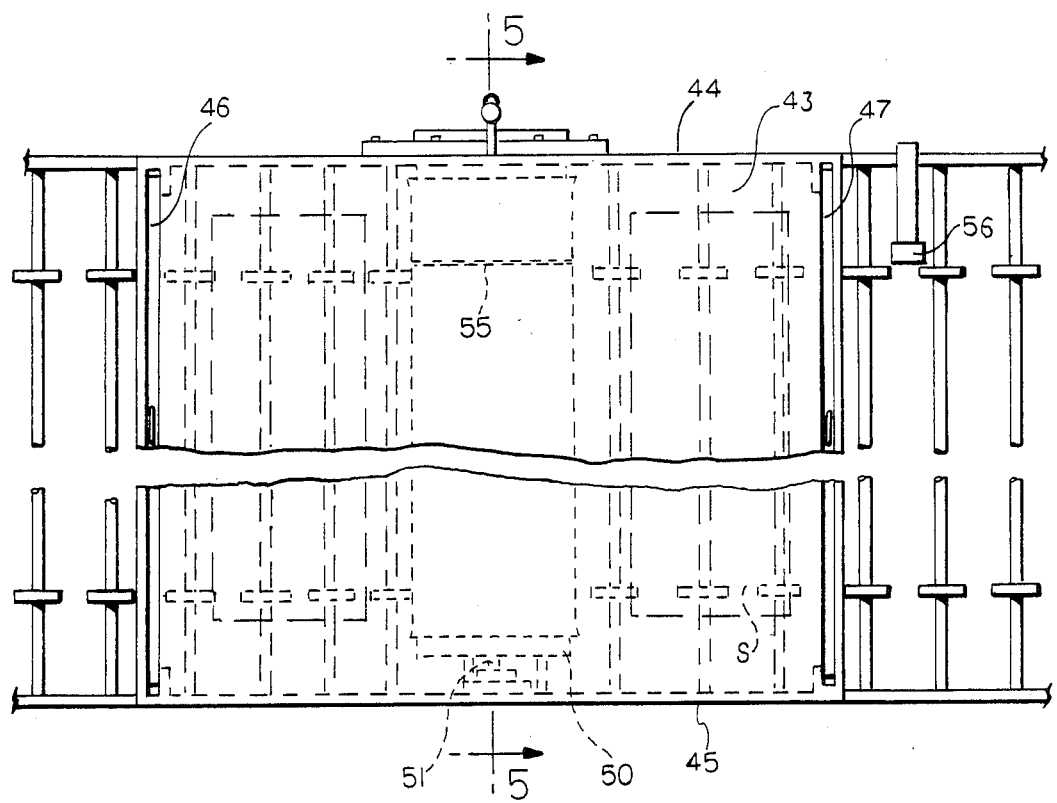
FIG. 4 is a top plan view of a third embodiment of the invention in which a cylindrical magnetron cathode is used.

Turning now to FIGS. 4 and 5, there is illustrated the application of the principle of the invention to a cylindrical sputtering target shown being used to sputter on generally flat, horizontal substrates. In this embodiment, the cathode assembly, generally designated 40, is mounted in an evacuable coating chamber 41. The coating chamber is generally rectangular in configuration and is composed of a bottom wall 42, top wall 43, opposed side walls 44 and 45, and openable ends. The end walls of the chamber 41 are closed by gates 46 and 47 which are vertically slidable in suitable channels supported by the side walls of the chamber 41. A vacuum pump is provided to evacuate the chamber 41 to the desired operating pressure. A valved passage 48 is connected to the chamber for the purpose of providing access to the interior of the chamber for injecting ionizable gases and/or other reactant gases as may be desired.

The cathode assembly 40 illustrated comprises a generally elongated cylindrical tube 50 closed at one end, which is supported for rotation about its horizontal axis by a pin 51 supported within a recess in an end block 52. The other end of the tube is rotatably supported in a sealed opening in the chamber.

The specific configuration of the cathode assembly 40 of FIG. 5 is essentially the same as disclosed in U.S. Pat. No. 4,356,073, reference to which may be had and which disclosure is incorporated herein by such reference. In the present invention the cathode tube 50 carries a layer 53 of the selected coating or target material to be deposited onto the substrates being coated. Thus, the tube 50 and the layer of material 53 thereon constitute the cylindrical target. The layer 53 is uniformly distributed throughout the circumference and length of the tube 50, with the exception that at the extreme ends thereof it is of a slightly greater thickness (exaggerated in the drawing), since it has been Applicant's experience that the tubular target tends to erode more rapidly at the extreme ends thereof. Between the layer 53 and the tube 50, at a selected position axially of the tube, is an extremely thin layer or coating of a detectable material 54. The detectable material may be of a thickness less than 50 microns. The layer of detectable material 54 is covered by the layer 53 of target material; however, at the precise position overlying the detectable material 54, the layer 53 of sputtering material is provided with a slightly thinner cross section, such as a depression or groove 55, running circumferentially about the tube 50. This groove 55, as viewed in FIG. 4, is adjacent one end of the tubular target. However, its position along the length of the target is purely a matter of choice, it being advisable that it be positioned such that most, if not all, of those successive, individual substrates being coated will pass beneath the grooved area of the target. Obviously, when the target is about depleted, the grooved area will be eroded through and the detectable material beneath this area will be sputtered onto the substrate. In alignment with the groove 55, external to the chamber 50, will be positioned a detector 56 for indicating the presence of the detectable material on the substrate being coated. Thus, it can be seen that with this embodiment of the invention wherein a tubular magnetron target is utilized, the principle of the invention of applying a detectable material between the target material and the cathode proper will be detected in a similar fashion to the planar target depletion detection.

With reference now to the embodiment shown in FIGS. 6 and 7, there is illustrated the matter of detecting the depletion of the cathode itself when the cathode is the target or sputtered substance, in which case the cathode is formed of the material to be sputtered. For example, in FIG. 6, a tubular magnetron target 57 formed of a material to be sputtered, for example, copper or stainless steel, may be mounted and magnetically enhanced in the same manner as described with respect to the embodiment of FIGS. 4 and 5 above and as disclosed in U.S. Pat. No. 4,356,073 cited above and incorporated herein by reference. In this embodiment, the tube 57 is provided with a deeply drilled hole 58, whose bottom approaches the opposite or inside surface of the tube 57. Within this hole 58 is placed a thin layer of the detectable material 59. The layer of detectable material is covered and the hole 58 filled with the same sputtering material so that the tube 57 exhibits a clean, uninterrupted cylindrical outer surface serving as the sputtering target.

Here again, as the target or tube 57 becomes depleted, and remembering the fact that this tube is internally cooled by water, it is desirable to be able to detect in advance that the depletion of the tube 57 is imminent to avoid actual rupture. Thus, as the tube 57 is used and the surface thereof is depleted by sputtering, a point in time will be reached when the thickness of the tube as it erodes will approach the depth of the layer of detectable material, and again, when the detectable material appears on the substrate and is sensed by the detector, the safe depletion of the target has been fulfilled and the replacement of the target would be in order.

As previously stated, when the water-cooled cathode is the actual sputtering material, there is the danger of a highly undesirable occurrence happening, and thus it is significant that the present invention will provide a clear indication of the impending rupture of the target. In this case, the piercing of the cathode is avoided by being forewarned and the system may be shut down and the cathode changed without endangering the integrity of the interior of the chamber.

In all of the embodiments suggested and illustrated herein, it should be kept in mind that when the cylindrical magnetron is being utilized in the sputtering operation, the cylinder may be continuously rotated to bring new areas into the sputtering zone. As is well know, the greatest erosion occurs at the area immediately beneath the arc of the lines of force produced by the magnetic field. While the cylindrical target may be periodically shifted, it is also possible to maintain the magnets in the lower enhancing position and to have the target slowly rotated by a motor which will thereby ensure the fairly even erosion of the entire target surface and thus obviate the possible problem of having erosion occurring unevenly, and thus uneconomically from the standpoint of less than full utilization of the entire target material. It has been Applicant's experience that targets where very thin coatings are being applied to the substrates may operate for as long as 30 days, and in this time it is difficult to predict with any precision, or even generally predict, the approximate time of depletion of the cathode or the thickness of the sputtering material still remaining on the target. However, even with greater experience and with a longer period of operation, it is difficult to gauge, in a general way, when the target is reaching complete depletion.

With the present invention, it is possible to run the sputtering operation for a safe period of time. When the target is depleted to a specific degree such that the detectable material is picked up on the substrate, the time for changing targets is well defined and certain, and the danger of injuring a cathode or, in the case of the situation where the cathode is the sputtering material itself, the danger of piercing a cathode is more certainly avoided.

One example of a detectable material is a radioisotope which emits beta rays at a low level with a half life greater than several months dispersed in a metal electrode deposited on the target. The thickness of the detectable material with the radioisotope included may be in the range $2 \times 10^{-7}$ to $5 \times 10^{-6}$ inches. The detector or pickup would conveniently be a Geiger-Muller counter, properly calibrated for background radiation.

Another example of a detectable material is a thin layer of luminescent substance, such as zinc sulphate with a slight amount of copper sulfide, or phosphors, which are visible to the naked eye and which are very sensitive, being responsive to as little as 150 quanta/sec. or less of green light, incorporated in the metallic thin layer of the detecting material. The pickup in this instance would be in the form of a U.V. source focused on the substrate at the anticipated position of the sputtered detection material with a photo-sensitive pickup viewing the illuminated position of the substrate.

It should also be pointed out that in the event more than a single material is being deposited or coated on the substrate from a series of magnetron targets, it is within the purview of the invention that each magnetron target may be radioactively tagged with a different radioisotope of, i.e., silver-110, gold-195 or zinc-65 which have different, identifiable radioactivity, and thus the approaching depletion of an individual target can be distinguished from other targets being simultaneously used.

In addition to the radioactively detectable materials, it should be understood that other detectable material such as electrically detectable materials such as iron can be used, in which case the surface conductivity of the exiting substrate can be measured or a vertical magnetic field can be set up to span the substrate at the anticipated location of the iron sputter deposit, and the change in field strength of the field can be used to detect the presence of the iron. Hall effect devices having magneto-restrictive materials such as bismuth can be used as the sensitive instrument to detect changes in field strength.

In this same vein a Gaussmeter could be used to detect the presence of iron on the substrate. In effect, the material can be one which is of an electrically detectable substance such as iron, that is distinguishable from the material being sputtered. Another example would be an electrically conductive tin oxide coating detectable by measuring surface conductivity change of substrate.

In addition, the detection of a detectable material such as copper or gold would be feasible by measuring the surface reflectivity of the substrate as it leaves the sputtering zone.

This detection would be even possible when the substrate is moving out from the zone of sputtering and could be detected prior to leaving the chamber by providing a transparent viewing port in the chamber which will permit the impingement of a beam of light onto the substrate and a photo-sensitive pickup at the angle of reflectance.

While the foregoing description deals with the magnetron sputtering system where the substrate is a planar surface that is moved relative to either the planar target or cylindrical target, it is apparent that the principle of the invention would be equally applicable if the cylindrical target with detectable, radioactive material were being used coaxially relative to a cylindrical substrate that would be axially moved relative to the magnetron so as to be providing an internal or external coating on the substrate as it is scanned.

What is claimed:

1. The method of monitoring the erosion of a magnetron sputtering target in the process of sputtering a selected coating material on the target to form a thin film of the coating material on relatively flat substrates that are moved successively through a sputtering chamber, the improvement comprising, providing a thin layer of a detectable material which is distinguishable from the material to be sputter coated between the selected coating material and the target, monitoring the substrates that have received the sputtered coating material for a trace of the detectable material as an indication that the selected coating material on the target is near depletion and ceasing the sputtering and replacing the target when the detectable material is detected.

2. The method as set forth in claim 1, wherein said detectable material is radioactive and said monitoring comprises detecting the presence of a radioactive substance on the coated substrate.

3. The method as set forth in claim 1, wherein said detectable material is a fluorescent substance and said monitoring comprises detecting the presence of a fluorescent substance on the coated substrates.

4. The method of claim 3, wherein said fluorescent substance is an ultra-violet radiation activated material and said monitoring comprises irradiating said coated substrates with a source of U.V. radiation and detecting the presence of the fluorescent substance.

5. The method of claim 1, in which said detectable material is a phosphorescent substance and said monitoring comprises observing any phosphorescence glow on the sputter-coated substrates as an indication of target depletion.

6. The method of claim 1, wherein said detectable material is a reflective metal.

7. The method of claim 6, wherein said reflective metal material is gold or copper.

8. The method of claim 6, wherein said step of detecting the detectable material comprises impinging light on said substrate as it exits the coating chamber and at the location on the substrate where the detectable material will appear and measuring the reflectivity of said substrate as an index of the presence or absence of said detectable material.

9. The method of detecting the depletion of the coating material on a magnetron sputtering target support in the process of sputter coating thin films of coating material on a succession of substrates moved through a sputtering chamber comprising, providing a thin layer of a detectable material which is distinguishable from the coating material being sputtered between the coating material and the target support, monitoring the substrates that have been sputter-coated for a trace of the detectable material as the substrates leave the sputtering chamber as an indication of depletion of the coating material on the target, and ceasing the sputtering operation and replacing the target when the detectable material is sensed on a substrate.

10. The method of claim 9, wherein said detectable material is an electromagnetic material and said monitoring comprises measuring the electrical characteristics of the surface of the substrates to detect an electromagnetic material.

11. The method of claim 10, wherein said electromagnetic material is iron.

12. The method of claim 9, wherein said detectable material is a dielectric material.

13. The method of claim 12, wherein said dielectric material is detected by measuring the electrical characteristics of the surface of the substrate in the zone where the material will appear.

14. The method of claim 13, wherein said electrical characteristic being measured is surface conductivity.

15. A magnetron sputtering target, comprising a rotatable hollow cylinder of a sputter-coating material, stationary magnetic means within said cylinder, said cylinder being of uniform wall thickness, a small pocket of a detectable material which is distinguishable from the sputter coating material imbedded in said wall at a depth that is close to the inner surface of said cylinder, said detectable material being of a thickness of less than fifty microns.

16. The magnetron sputtering target of claim 15, wherein said cylinder is provided with an annular depression in its surface, and said pocket of detectable material is beneath said depression whereby the sputtering target will deplete immediately beneath said depression first during sputtering.

17. A magnetron sputtering target, comprising a conductive metal member, a layer of sputter-coating material on one surface of said member, an extremely thin layer of a detectable material which is distinguishable from the sputter-coating material interposed between said sputter-coating material and said metal member, said detectable material being over a limited zone of the conductive metal member and said sputter-coating material being of less thickness immediately overlying said detectable material, whereby said detectable material will be sputtered before the sputter-coating material is depleted at any other area.

* * * * *